United States Patent
Matsui

(10) Patent No.: US 12,522,930 B2
(45) Date of Patent: Jan. 13, 2026

(54) METAL REMOVAL METHOD, DRY ETCHING METHOD, AND PRODUCTION METHOD FOR SEMICONDUCTOR ELEMENT

(71) Applicant: SHOWA DENKO K.K., Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 17/607,933

(22) PCT Filed: Apr. 17, 2020

(86) PCT No.: PCT/JP2020/016929
§ 371 (c)(1),
(2) Date: Nov. 1, 2021

(87) PCT Pub. No.: WO2020/230522
PCT Pub. Date: Nov. 19, 2020

(65) Prior Publication Data
US 2022/0325418 A1    Oct. 13, 2022

(30) Foreign Application Priority Data
May 15, 2019  (JP) ................. 2019-092401

(51) Int. Cl.
*C23F 1/12* (2006.01)
*C23F 1/02* (2006.01)
(Continued)

(52) U.S. Cl.
CPC ............... *C23F 1/12* (2013.01); *C23F 1/02* (2013.01); *H01L 21/30621* (2013.01);
(Continued)

(58) Field of Classification Search
None
See application file for complete search history.

(56) References Cited

U.S. PATENT DOCUMENTS

| 6,083,413 | A | * | 7/2000 | Sawin | ............... B08B 7/0057 257/E21.311 |
|---|---|---|---|---|---|
| 10,079,150 | B2 | | 9/2018 | Neumann, Jr. et al. | |

(Continued)

FOREIGN PATENT DOCUMENTS

| JP | 2004-228487 A | 8/2004 |
|---|---|---|
| JP | 2015-147704 A | 8/2015 |

(Continued)

OTHER PUBLICATIONS

International Search Report of PCT/JP2020/016929 dated Jul. 14, 2020 [PCT/ISA/210].

(Continued)

*Primary Examiner* — Stephanie P Duclair
(74) *Attorney, Agent, or Firm* — Sughrue Mion, PLLC

(57) ABSTRACT

A metal removal method which includes: a reaction step of bringing a treatment gas containing a fluorine-containing interhalogen compound and a metal-containing material containing a metal element into contact with each other to generate metal fluoride which is a reaction product of the fluorine-containing interhalogen compound and the metal element; and a volatilization step of heating the metal fluoride under an inert gas atmosphere or in a vacuum environment for volatilization. The metal element is at least one kind selected from iron, cobalt, nickel, selenium, molybdenum, rhodium, palladium, tungsten, rhenium, iridium, and platinum. Also disclosed is a dry etching method using the metal removal method and a production method for a semiconductor element using the dry etching method.

15 Claims, 1 Drawing Sheet

(51) Int. Cl.
  *H01L 21/306* (2006.01)
  *H01L 21/311* (2006.01)
  *H01L 21/3213* (2006.01)
  *H01L 21/465* (2006.01)

(52) U.S. Cl.
  CPC .. *H01L 21/31116* (2013.01); *H01L 21/32138* (2013.01); *H01L 21/465* (2013.01)

(56) References Cited

U.S. PATENT DOCUMENTS

| | | | |
|---|---|---|---|
| 10,273,584 B2 | 4/2019 | Blomberg et al. | |
| 11,049,729 B2 | 6/2021 | Suzuki et al. | |
| 2009/0074646 A1* | 3/2009 | Sasagawa | B01D 53/002 423/489 |
| 2010/0154835 A1 | 6/2010 | Dimeo et al. | |
| 2015/0129546 A1* | 5/2015 | Ingle | C23F 1/02 216/75 |
| 2017/0025282 A1 | 1/2017 | Neumann, Jr. et al. | |
| 2017/0040214 A1 | 2/2017 | Lai et al. | |
| 2017/0053810 A1* | 2/2017 | Yang | C23F 4/00 |
| 2017/0365478 A1* | 12/2017 | George | H01L 21/67253 |
| 2018/0166255 A1 | 6/2018 | Blomberg et al. | |
| 2018/0327913 A1* | 11/2018 | Lansalot-Matras | H01L 21/31122 |
| 2019/0067032 A1 | 2/2019 | Shinoda et al. | |
| 2019/0287808 A1* | 9/2019 | Goradia | H01L 21/3086 |
| 2019/0355590 A1 | 11/2019 | Suzuki et al. | |
| 2021/0020454 A1 | 1/2021 | Kal et al. | |

FOREIGN PATENT DOCUMENTS

| | | |
|---|---|---|
| JP | 2017-053024 A | 3/2017 |
| JP | 2017-063186 A | 3/2017 |
| JP | 2019-040932 A | 3/2019 |
| KR | 10-2017-0012144 A | 2/2017 |
| TW | 200802564 A | 1/2008 |
| TW | 201835379 A | 10/2018 |
| WO | 2017/047400 A1 | 3/2017 |
| WO | 2018/180655 A1 | 10/2018 |
| WO | 2021/011101 A1 | 1/2021 |

OTHER PUBLICATIONS

International Preliminary Report on Patentability with a translation of Written Opinion dated Nov. 25, 2021 from the International Bureau in International Application No. PCT/JP2020/016929.

* cited by examiner

METAL REMOVAL METHOD, DRY ETCHING METHOD, AND PRODUCTION METHOD FOR SEMICONDUCTOR ELEMENT

CROSS REFERENCE TO RELATED APPLICATIONS

This application is a National Stage of International Application No. PCT/JP2020/016929, filed Apr. 17, 2020, claiming priority to Japanese Patent Application No. 2019-092401, filed May 15, 2019.

TECHNICAL FIELD

The present invention relates to a metal removal method, a dry etching method, and a production method for a semiconductor element.

BACKGROUND ART

As magnetic materials and wiring line materials constituting semiconductor elements, such as non-volatile memory elements, transition metal elements, such as iron (Fe), cobalt (Co), nickel (Ni), selenium (Se), molybdenum (Mo), rhodium (Rh), palladium (Pd), tungsten (W), rhenium (Re), iridium (Ir), and platinum (Pt) are used in some cases. In a semiconductor element production step, a sputtering method or a wet etching method is used in some cases when a metal thin film on a substrate is etched to form wiring lines.

CITATION LIST

Patent Literature

PTL 1: JP 2004-228487 A

SUMMARY OF INVENTION

Technical Problem

However, the sputtering method or the wet etching method has posed a risk of etching even a part of the semiconductor element which should basically not be etched, resulting in a loss of the characteristics of the semiconductor element.

PTL 1 discloses a method for dry etching a metal thin film on a substrate using an etching gas excited by plasma, but the etching method using plasma has had a problem of high cost.

It is an object of the present invention to provide a metal removal method, a dry etching method, and a production method for a semiconductor element, which can be implemented at a low cost.

Solution to Problem

In order to solve the above-described problem, one aspect of the present invention is as described in [1] to [9] below.
[1] A metal removal method including:
a reaction step of bringing a treatment gas containing a fluorine-containing interhalogen compound and a metal-containing material containing a metal element into contact with each other to generate metal fluoride which is a reaction product of the fluorine-containing interhalogen compound and the metal element; and
a volatilization step of heating the metal fluoride under an inert gas atmosphere or in a vacuum environment for volatilization, in which
the metal element is at least one kind selected from the group consisting of iron, cobalt, nickel, selenium, molybdenum, rhodium, palladium, tungsten, rhenium, iridium, and platinum.
[2] The metal removal method according to [1], in which the fluorine-containing interhalogen compound is at least one kind selected from the group consisting of chlorine monofluoride, bromine monofluoride, chlorine trifluoride, chlorine pentafluoride, bromine pentafluoride, and iodine heptafluoride.
[3] The metal removal method according to [1] or [2], in which the treatment gas contains at least one kind of inert gas selected from the group consisting of nitrogen gas, helium, neon, argon, krypton, and xenon.
[4] The metal removal method according to any one of [1] to [3], in which the reaction temperature of the fluorine-containing interhalogen compound and the metal element in the reaction step is 0° C. or more and 100° C. or less.
[5] The metal removal method according to any one of [1] to [4], in which the heating temperature of the metal fluoride in the volatilization step is higher than the reaction temperature of the fluorine-containing interhalogen compound and the metal element in the reaction step.
[6] The metal removal method according to [5], in which the heating temperature of the metal fluoride in the volatilization step is 50° C. or more and 400° C. or less.
[7] The metal removal method according to anyone of [1] to [6] including: in the reaction step, bringing the treatment gas into contact with a silicon-containing material containing at least one of silicon oxide and silicon nitride and the metal-containing material.
[8] A dry etching method using the metal removal method according to any one of [1] to [7].
[9] A production method for a semiconductor element including: a dry etching step of removing at least one portion of a metal-containing layer containing at least one kind of metal element selected from the group consisting of iron, cobalt, nickel, selenium, molybdenum, rhodium, palladium, tungsten, rhenium, iridium, and platinum from a semiconductor substrate having the metal-containing layer using the dry etching method according to claim 8.

Advantageous Effects of Invention

According to the present invention, metal removal and dry etching can be carried out at a low cost.

BRIEF DESCRIPTION OF DRAWINGS

FIG. 2 is a view illustrating a sample used in Examples and the like.

DESCRIPTION OF EMBODIMENTS

Figure 1:
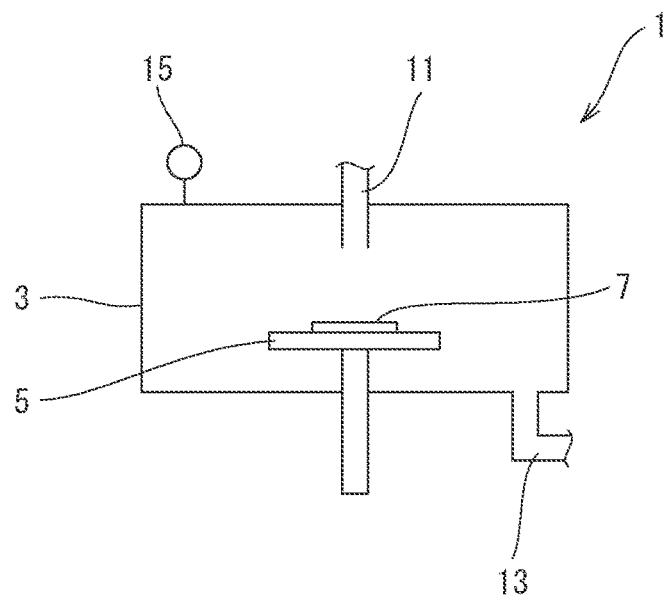
FIG. 1 is a schematic diagram illustrating the structure of a reactor used in Examples, Comparative Examples, and Reference Examples.

One embodiment of the present invention will now be described below. This embodiment describes an example of the present invention and the present invention is not limited to this embodiment. Further, this embodiment can be variously altered or modified and embodiments obtained by such alternations or modifications may also be included in the present invention.

As a result of various examinations to solve the above-described problem, the present inventors have found that a fluoride-containing interhalogen compound is brought into contact with a metal element, such as W or Ir, to generate metal fluoride which is a reaction product of the metal element and the fluoride-containing interhalogen compound, and then the metal fluoride is heated in a reduced pressure environment or the like to volatilize the metal fluoride, thereby enabling the removal of a metal-containing material containing the metal element, and thus have completed the present invention.

More specifically, a metal removal method according to one embodiment of the present invention includes a reaction step of bringing a treatment gas containing a fluorine-containing interhalogen compound and a metal-containing material containing a metal element into contact with each other to generate metal fluoride which is a reaction product of the fluorine-containing interhalogen compound and the metal element and a volatilization step of heating the metal fluoride under an inert gas atmosphere or in a vacuum environment for volatilization. The metal element contained in the metal-containing material is at least one kind selected from the group consisting of iron, cobalt, nickel, selenium, molybdenum, rhodium, palladium, tungsten, rhenium, iridium, and platinum. In the metal removal method of this embodiment, the metal may be removed by alternately repeating the reaction step and the volatilization step. Alternatively, the reaction step and the volatilization step may be performed at the same time.

In the reaction step, the fluorine-containing interhalogen compound (e.g., $BrF_5$) in the treatment gas reacts with the metal element contained in the metal-containing material to generate metal fluoride which is presumed to be a fluorine-containing halogen-containing metal complex (e.g., $[BrF_4][MF_6]$, in which M is a metal element). Therefore, a remarkable mass increase arises in the metal-containing material. Such metal fluoride has a vapor pressure higher than that of simple substances, oxides, nitrides, and the like of the metal elements, and therefore is volatilized and removed by heating in the volatilization step.

The metal removal method of this embodiment has no necessity of bringing the fluorine-containing interhalogen compound into an excited state, such as plasma, and therefore metal removal can be carried out at a low cost and corrosion is unlikely to occur in a reaction vessel, piping, and the like used in the metal removal method of this embodiment and a dry etching method of this embodiment described later.

According to the metal removal method of this embodiment, even stable metals, such as iron, cobalt, nickel, selenium, molybdenum, rhodium, palladium, tungsten, rhenium, iridium, and platinum, can be easily removed.

By the use of the metal removal method of this embodiment, metal deposits can be removed from members or devices for cleaning. For example, when metal deposits containing the metal elements mentioned above are deposited on the inner surface of a chamber (for example, a chamber constituting a semiconductor producing device) in which a reaction involving the metal elements mentioned above, such as Ir and W, is performed, the metal deposits deposited on the inner surface of the chamber can be removed (cleaned) at a low cost by implementing the metal removal method of this embodiment in the chamber. For example, in the case of a chamber constituting a semiconductor producing device, the above-described cleaning may be performed as a post-step of a step of forming a metal-containing material containing the metal elements mentioned above on a semiconductor substrate to form a metal-containing layer or a post step after a step of etching the metal-containing layer.

Dry etching can be performed utilizing the metal removal method of this embodiment. More specifically, the dry etching method according to another embodiment of the present invention is a dry etching method for etching metal using the above-described metal removal method. The dry etching method of this embodiment has no necessity of using plasma, and therefore the etching can be carried out at a low cost.

A semiconductor element can be produced using the dry etching method of this embodiment. More specifically, a production method for a semiconductor element according to still another embodiment of the present invention includes a dry etching step of removing at least one portion of a metal-containing layer containing at least one kind of metal element selected from the group consisting of iron, cobalt, nickel, selenium, molybdenum, rhodium, palladium, tungsten, rhenium, iridium, and platinum from a semiconductor substrate having the metal-containing layer by the above-described dry etching method.

The metal-containing layer is formed on the semiconductor substrate, a mask having a predetermined pattern is formed on the metal-containing layer, and then the etching is performed by the above-described dry etching method. Then, one part of the metal-containing layer is removed from the semiconductor substrate, and the pattern mentioned above is transferred to the metal-containing layer, so that wiring lines or the like can be formed on the semiconductor substrate.

The production method for a semiconductor element of this embodiment has no necessity of using plasma, and therefore a semiconductor element can be produced at a low cost. When a wet etching method is adopted, there is a problem that even a part of the semiconductor element which should basically not be etched may be etched, resulting in a loss of the characteristics of the semiconductor element. However, in the production method for a semiconductor element of this embodiment, the metal-containing layer is removed by the dry etching method, and therefore the above-described problem is unlikely to occur.

Hereinafter, the metal removal method of this embodiment is described in more detail.

The metal-containing material containing the metal elements may be simple metal of the metal elements mentioned above, may be a compound of the metal elements mentioned above (for example, metal oxides, metal nitrides, metal halides, metal salts), or may be an alloy of two or more kinds of the metal elements mentioned above.

The metal-containing material containing the metal elements may contain only the simple metals, compounds, and alloys mentioned above or may contain other components. More specifically, the metal-containing material containing the metal elements may be a mixture of at least one of the simple metals, compounds, and alloys mentioned above and other components. Examples of this mixture include alloys of the metal elements mentioned above and different kinds of metal elements and compositions containing at least one of the simple metals, compounds, and alloys mentioned above and other components. In this mixture, the composition ratio of the simple metals, compounds, and alloys mentioned above is preferably 30% by mass or more and more preferably 50% by mass or more.

The shape of the metal-containing material containing the metal elements is not particularly limited and may be a thin film shape, a foil shape, a powder shape, or a lump shape.

The type of the fluorine-containing interhalogen compound is not particularly limited and at least one kind selected from the group consisting of chlorine monofluoride (ClF), bromine monofluoride (BrF), chlorine trifluoride (ClF$_3$), iodine trifluoride (IF$_3$), chlorine pentafluoride (ClF$_5$), bromine pentafluoride (BrF$_5$), and iodine heptafluoride (IF$_7$) is usable. Among the above-described fluorine-containing interhalogen compounds, bromine pentafluoride and iodine heptafluoride are more preferable.

The reaction temperature of the fluorine-containing interhalogen compound and the metal element in the reaction step needs to be a temperature at which the fluorine-containing interhalogen compound contained in the treatment gas can be present in a gaseous state (temperature equal to or more than the boiling point of the fluorine-containing interhalogen compound). The reaction temperature of the fluoride-containing interhalogen compound and the metal element in the reaction step is preferably 0° C. or more and 100° C. or less, more preferably 10° C. or more and 80° C. or less, and still more preferably 15° C. or more and 50° C. or less.

When the reaction temperature is within the ranges mentioned above, the reaction rate of the reaction between the fluoride-containing interhalogen compound and the metal element is likely to be sufficiently high, and, in addition thereto, a reaction between the fluorine-containing interhalogen compound and substances other than the metal elements mentioned above (for example, substances which should basically not be reacted) is unlikely to occur.

When a fluorine gas is used, highly volatile metal fluoride can be generated and removed by a reaction between the fluorine gas and the metal elements. However, when plasma is not used, a high temperature of 150° C. or more is required for the reaction between the fluorine gas and the metal elements mentioned above. Under such a high temperature condition, the fluorine gas may react with silicon, silicon oxide, and the like (equivalent to the "substances which should basically not be reacted"), making it difficult to apply the metal removal method and the dry etching method of this embodiment to a semiconductor element production step.

The treatment gas used in the reaction step may be formed only of the fluorine-containing interhalogen compound or may be a mixed gas containing the other kinds of gases. When the treatment gas is a mixed gas, the concentration of the fluorine-containing interhalogen compound in the treatment gas is preferably 1 vol % or more, more preferably 5 vol % or more, and still more preferably 10 vol % or more in order to obtain a sufficient reaction rate.

As the other kinds of gases used when the treatment gas is a mixed gas, at least one kind of inert gas selected from the group consisting of nitrogen gas (N$_2$), helium (He), neon (Ne), argon (Ar), krypton (Kr), and xenon (Xe) is usable. The concentration of the inert gas in the treatment gas can be set in the range of 0 vol % or more and 90 vol % or less, for example.

The atmospheric pressure in the reaction step is not particularly limited and can be set to 0.1 kPa or more and 101.3 kPa or less, for example. The flow rate of the treatment gas may be determined as appropriate within a range where the atmospheric pressure can be kept constant according to the size of a reaction vessel and the capacity of an evacuator for reducing the pressure inside the reaction vessel.

The volatilization step is carried out by heating the metal fluoride under an inert gas atmosphere or in a vacuum environment.

The heating temperature of the metal fluoride in the volatilization step is preferably set to be higher than the reaction temperature of the fluoride-containing interhalogen compound and the metal element in the reaction step in order to rapidly volatilize the metal fluoride. For example, the heating temperature of the metal fluoride in the volatilization step is set to preferably a temperature higher by 5° C. or more, more preferably a temperature higher by 10° C. or more, and still more preferably a temperature higher by 20° C. or more than the reaction temperature of the fluoride-containing interhalogen compound and the metal element in the reaction step.

The heating temperature of the metal fluoride in the volatilization step is not particularly limited insofar as the metal fluoride can be volatilized and is preferably 40° C. or more and 500° C. or less, more preferably 45° C. or more and 400° C. or less, still more preferably 50° C. or more and 400° C. or less, and yet still more preferably 50° C. or more and 350° C. or less.

When the heating temperature of the metal fluoride in the volatilization step is within the ranges mentioned above, the volatilization rate of the metal fluoride is likely to be sufficiently high, and, in addition thereto, the time and the energy required for the volatilization of the metal fluoride are unlikely to be excessive.

As the inert gas, at least one kind selected from the group consisting of nitrogen gas, helium, neon, argon, krypton, and xenon is usable, for example. The inert gas atmosphere is preferably an atmosphere in which the inert gas is circulated at a pressure of 0.1 kPa or more and 101.3 kPa or less. The vacuum environment in the volatilization step is preferably an environment in which the pressure is reduced to 0.1 Pa or more and 100 Pa or less.

The fluorine-containing interhalogen compound, such as BrF$_5$, in a non-excited state hardly reacts with silicon oxides and silicon nitrides at temperatures equal to or less than 100° C. Therefore, when the treatment gas is brought into contact with both a silicon-containing material containing at least one of silicon oxides and silicon nitrides and the metal-containing material containing the metal elements mentioned above in the reaction step, the silicon-containing material containing at least one of silicon oxides and silicon nitrides is hardly removed, and the metal-containing material containing the metal elements mentioned above is selectively removed.

Therefore, when the dry etching using the metal removal method of this embodiment is applied to the semiconductor substrate having the metal-containing layer containing the metal elements mentioned above and the silicon-containing layer containing at least one of silicon oxides and silicon nitrides, a semiconductor element can be produced with at least one part of the metal-containing layer being etched and with the silicon-containing layer being hardly etched.

EXAMPLES

Hereinafter, the present invention is described in more detail by illustrating Examples, Comparative Examples, and Reference Examples. First, the structure of a reactor 1 used in Examples, Comparative Examples, and Reference Examples is described with reference to FIG. 1.

The reactor 1 in FIG. 1 is provided with a chamber 3 in which the reaction is carried out. In this chamber 3, a stage 5 on which a sample 7 is placed is installed. The chamber 3 is provided with a gas introduction port 11 introducing a treatment gas (hereinafter, a gas reacting with metal among treatment gases is sometimes referred to as "etching gas") into the chamber 3, a gas discharge port 13 discharging the treatment gas and the metal fluoride from the inside of the chamber 3, a pressure reducing device (not illustrated) reducing the pressure inside the chamber 3, and a pressure gauge 15 measuring the pressure inside the chamber 3.

The stage 5 further has a function as a heating device, and thus the sample 7 on the stage 5 can be heated to a desired temperature. The reactor 1 is further provided with a heating device (not illustrated) heating the outer wall of the chamber 3, and thus the inside of the chamber 3 can be controlled to a desired temperature.

The sample 7 is placed on the stage 5, and then heat is applied by at least one of the stage 5 and the above-described heating device and the treatment gas is introduced into the chamber 3 from the gas introduction port 11 are performed. Then, the treatment gas is brought into contact with the sample 7 under a predetermined temperature condition, so that metal of the sample 7 reacts with the treatment gas. Thereafter, in order to volatilize metal fluoride generated in the reaction, the inside of the chamber 3 is reset to a predetermined temperature, and then a gas containing the metal fluoride is discharged from the gas discharge port 13 to the outside of chamber 3 to be removed. It may be acceptable that, during the removal of the metal fluoride, the treatment gas is always introduced from the gas introduction port 11 into the chamber 3 and the gas discharge port 13 is opened to discharge a gas containing the treatment gas or the metal fluoride to the outside of the chamber 3.

Dry etching of metal can be performed using the reactor 1 and using the treatment gas as the etching gas. By the dry etching of metal using the reactor 1, a metal thin film (metal-containing layer) on a semiconductor substrate having a silicon-containing material can be etched to form wiring lines, and therefore the reactor 1 is usable for producing a semiconductor element.

Next, metal removal treatment of Examples, Comparative Examples, and Reference Examples performed using the reactor 1 is described.

Example 1-1

Ir powder (manufactured by Furuya Metal Co., Ltd., average particle size of 0.3 μm, purity of 99.9%), which is the sample 7, was placed on the stage 5, and then the sample 7 was heated to 30° C. by the stage 5. $BrF_5$, which is the treatment gas, was discharged to the outside of the chamber 3 having an internal volume of 2500 cm$^3$ from the gas discharge port 13 while introducing $BrF_5$ into the chamber 3 from the gas introduction port 11, thereby circulating the treatment gas in the chamber 3 (reaction step). The treatment gas was circulated for 10 minutes at a flow rate of 100 sccm. The pressure inside the chamber 3 was set to 101 kPa. Herein, sccm is the volumetric flow rate (cm$^3$) per minute standardized under the condition of 0° C. and 1 atm.

When the circulation of the treatment gas was completed, the pressure inside the chamber 3 was reduced to 100 Pa or less and the sample 7 was heated to 100° C. by the stage 5 (volatilization step). The heating of the sample 7 was performed for 30 minutes, the inside of the chamber 3 was replaced with nitrogen gas, the sample 7 was taken out, and then the mass of the sample 7 was measured. Then, the mass reduction rate of the sample 7 was calculated by the following expression. The results are shown in Table 1.

Mass reduction rate (%)=(Mass of sample 7 before metal removal treatment−Mass of sample 7 after metal removal treatment)/Mass of sample 7 before metal removal treatment The average particle size of powder, such as the Ir powder, was determined on a volume basis by a laser diffraction/scattering particle size distribution analyzer Partica LA-960 manufactured by Horiba Ltd.

TABLE 1

| | | | | Reaction step | | Volatilization step | |
|---|---|---|---|---|---|---|---|
| | Sample | Etching gas | Inert gas | Etching gas/Inert gas (sccm/sccm) | Temperature (° C.) | Temperature (° C.) | Mass reduction rate (%) |
| Ex. 1-1 | Ir | $BrF_5$ | — | — | 30 | 100 | 100 |
| Ex. 1-2 | Ir | $IF_7$ | — | — | 30 | 100 | 96 |
| Ex. 1-3 | Ir | $BrF_5$ | — | — | 0 | 100 | 92 |
| Ex. 1-4 | Ir | $IF_7$ | — | — | 0 | 100 | 89 |
| Ex. 1-5 | Ir | $BrF_5$ | Ar | 50/50 | 30 | 100 | 100 |
| Ex. 1-6 | Ir | $BrF_5$ | He | 50/50 | 30 | 100 | 100 |
| Ex. 1-7 | Ir | $BrF_5$ | $N_2$ | 50/50 | 30 | 100 | 100 |
| Ex. 1-8 | Ir | $BrF_5$ | $N_2$ | 30/70 | 30 | 100 | 100 |
| Ex. 1-9 | Ir | $IF_7$ | Ar | 50/50 | 30 | 100 | 97 |
| Ex. 1-10 | Ir | $IF_7$ | He | 50/50 | 30 | 100 | 95 |
| Ex. 1-11 | Ir | $IF_7$ | $N_2$ | 50/50 | 30 | 100 | 96 |
| Ex. 1-12 | Ir | $IF_7$ | $N_2$ | 30/70 | 30 | 100 | 96 |
| Comp. Ex. 1-1 | Ir | $F_2$ | — | — | 30 | 100 | Less than 1 |
| Comp. Ex. 1-2 | Ir | $BrF_5$ | — | — | 30 | — | Mass increased |
| Ex. 2-1 | W | $BrF_5$ | — | — | 30 | 100 | 100 |
| Ex. 2-2 | W | $IF_7$ | — | — | 30 | 100 | 94 |
| Comp. Ex. 2-1 | W | $F_2$ | — | — | 30 | 100 | 15 |
| Ex. 3-1 | Se | $BrF_5$ | — | — | 30 | 50 | 100 |
| Ex. 3-2 | Se | $IF_7$ | — | — | 30 | 50 | 100 |
| Comp. Ex. 3-1 | Se | $F_2$ | — | — | 30 | 50 | Less than 1 |
| Ex. 4-1 | Mo | $BrF_5$ | — | — | 30 | 100 | 98 |
| Ex. 4-2 | Mo | $IF_7$ | — | — | 30 | 100 | 92 |
| Comp. Ex. 4-1 | Mo | $F_2$ | — | — | 30 | 100 | Less than 1 |
| Ex. 5-1 | Rh | $BrF_5$ | — | — | 30 | 100 | 98 |
| Ex. 5-2 | Rh | $IF_7$ | — | — | 30 | 100 | 96 |
| Comp. Ex. 5-1 | Rh | $F_2$ | — | — | 30 | 100 | Less than 1 |
| Ex. 6-1 | Pd | $BrF_5$ | — | — | 30 | 350 | 82 |
| Ex. 6-2 | Pd | $IF_7$ | — | — | 30 | 350 | 67 |
| Comp. Ex. 6-1 | Pd | $F_2$ | — | — | 30 | 350 | Less than 1 |
| Ex. 7-1 | Re | $BrF_5$ | — | — | 30 | 100 | 89 |

TABLE 1-continued

| | | Reaction step | | | | Volatilization step | |
|---|---|---|---|---|---|---|---|
| | Sample | Etching gas | Inert gas | Etching gas/Inert gas (sccm/sccm) | Temperature (° C.) | Temperature (° C.) | Mass reduction rate (%) |
| Ex. 7-2 | Re | IF$_7$ | — | — | 30 | 100 | 80 |
| Comp. Ex. 7-1 | Re | F$_2$ | — | — | 30 | 100 | Less than 1 |
| Ex. 8-1 | Pt | BrF$_5$ | — | — | 30 | 100 | 95 |
| Ex. 8-2 | Pt | IF$_7$ | — | — | 30 | 100 | 95 |
| Comp. Ex. 8-1 | Pt | F$_2$ | — | — | 30 | 100 | Less than 1 |
| Ex. 9-1 | Fe | BrF$_5$ | — | — | 100 | 350 | 37 |
| Ex. 9-2 | Fe | IF$_7$ | — | — | 100 | 350 | 25 |
| Comp. Ex. 9-1 | Fe | F$_2$ | — | — | 100 | 350 | Less than 1 |
| Ex. 10-1 | Co | BrF$_5$ | — | — | 100 | 350 | 57 |
| Ex. 10-2 | Co | IF$_7$ | — | — | 100 | 350 | 45 |
| Comp. Ex. 10-1 | Co | F$_2$ | — | — | 100 | 350 | Less than 1 |
| Ex. 11-1 | Ni | BrF$_5$ | — | — | 100 | 350 | 49 |
| Ex. 11-2 | Ni | IF$_7$ | — | — | 100 | 350 | 44 |
| Comp. Ex. 11-1 | Ni | F$_2$ | — | — | 100 | 350 | Less than 1 |
| Ref. Ex. 1-1 | SiO$_2$ | BrF$_5$ | — | — | 30 | 350 | Less than 1 |
| Ref. Ex. 1-2 | SiO$_2$ | IF$_7$ | — | — | 30 | 350 | Less than 1 |
| Ref. Ex. 1-3 | SiO$_2$ | BrF$_5$ | — | — | 100 | 350 | 8 |
| Ref. Ex. 1-4 | SiO$_2$ | IF$_7$ | — | — | 100 | 350 | 7 |
| Ref. Ex. 2-1 | Si$_3$N$_4$ | BrF$_5$ | — | — | 30 | 350 | Less than 1 |
| Ref. Ex. 2-2 | Si$_3$N$_4$ | IF$_7$ | — | — | 30 | 350 | Less than 1 |
| Ref. Ex. 2-3 | Si$_3$N$_4$ | BrF$_5$ | — | — | 100 | 350 | 20 |
| Ref. Ex. 2-4 | Si$_3$N$_4$ | IF$_7$ | — | — | 100 | 350 | 14 |

Example 1-2

The metal removal treatment was performed in the same manner as in Example 1-1, except that the etching gas was set to IF$_7$, and then the mass reduction rate was calculated. The result is shown in Table 1.

Example 1-3

The metal removal treatment was performed in the same manner as in Example 1-1, except that the reaction temperature in the reaction step was set to 0° C. and the pressure inside the chamber 3 was set to $10^{-2}$ MPa, and then the mass reduction rate was calculated. The result is shown in Table 1.

Example 1-4

The metal removal treatment was performed in the same manner as in Example 1-2, except that the reaction temperature in the reaction step was set to 0° C., and then the mass reduction rate was calculated. The result is shown in Table 1.

Example 1-5

The metal removal treatment was performed in the same manner as in Example 1-1, except that the etching gas and the flow rate were set to BrF$_5$/Ar=50 sccm/50 sccm, and then the mass reduction rate was calculated. The result is shown in Table 1.

Example 1-6

The metal removal treatment was performed in the same manner as in Example 1-1, except that the etching gas and the flow rate were set to BrF$_5$/He=50 sccm/50 sccm, and then the mass reduction rate was calculated. The result is shown in Table 1.

Example 1-7

The metal removal treatment was performed in the same manner as in Example 1-1, except that the etching gas and the flow rate were set to BrF$_5$/N$_2$=50 sccm/50 sccm, and then the mass reduction rate was calculated. The result is shown in Table 1.

Example 1-8

The metal removal treatment was performed in the same manner as in Example 1-1, except that the etching gas and the flow rate were set to BrF$_5$/N$_2$=30 sccm/70 sccm, and then the mass reduction rate was calculated. The result is shown in Table 1.

Example 1-9

The metal removal treatment was performed in the same manner as in Example 1-1, except that the etching gas and the flow rate were set to IF$_7$/Ar=50 sccm/50 sccm, and then the mass reduction rate was calculated. The result is shown in Table 1.

Example 1-10

The metal removal treatment was performed in the same manner as in Example 1-1, except that the etching gas and the flow rate were set to IF$_7$/He=50 sccm/50 sccm, and then the mass reduction rate was calculated. The result is shown in Table 1.

Example 1-11

The metal removal treatment was performed in the same manner as in Example 1-1, except that the etching gas and the flow rate were set to IF$_7$/N$_2$=50 sccm/50 sccm, and then the mass reduction rate was calculated. The result is shown in Table 1.

Example 1-12

The metal removal treatment was performed in the same manner as in Example 1-1, except that the etching gas and the flow rate were set to $IF_7/N_2$=30 sccm/70 sccm, and then the mass reduction rate was calculated. The result is shown in Table 1.

Comparative Example 1-1

The metal removal treatment was performed in the same manner as in Example 1-1, except that the etching gas was set to $F_2$, and then the mass reduction rate was calculated. The result is shown in Table 1.

Comparative Example 1-2

The metal removal treatment was performed in the same manner as in Example 1-1, except that the volatilization step was not carried out and, after the completion of the reaction step, the inside of the chamber 3 was replaced with nitrogen gas, the sample 7 was taken out, and then the mass of the sample 7 was measured, and then the mass reduction rate was calculated. The result is shown in Table 1.

Example 2-1, Example 2-2, and Comparative Example 2-1

W powder (manufactured by The Nilaco Corporation, average particle size of 3 µm, purity of 99.9%) was used as the sample 7 and the treatment was performed under the conditions shown in Table 1. The results are shown in Table 1.

Example 3-1, Example 3-2, and Comparative Example 3-1

Se powder (manufactured by NACALAI TESQUE, INC., average particle size of 10 µm, purity of 99.9%) was used as the sample 7 and the treatment was performed under the conditions shown in Table 1. The results are shown in Table 1.

Example 4-1, Example 4-2, and Comparative Example 4-1

Mo powder (manufactured by A.L.M.T. Corp., average particle size of 6 µm, purity of 99.9%) was used as the sample 7 and the treatment was performed under the conditions shown in Table 1. The results are shown in Table 1.

Example 5-1, Example 5-2, and Comparative Example 5-1

Rh powder (manufactured by Kojundo Chemical Lab. Co., Ltd., average particle size of 30 µm, purity of 99.9%) was used as the sample 7 and the treatment was performed under the conditions shown in Table 1. The results are shown in Table 1.

Example 6-1, Example 6-2, and Comparative Example 6-1

Pd powder (manufactured by Aida chemical Industries Co., Ltd., average particle size of 8 µm, purity of 99.9%) was used as the sample 7 and the treatment was performed under the conditions shown in Table 1. The results are shown in Table 1.

Example 7-1, Example 7-2, and Comparative Example 7-1

Re powder (manufactured by New Metals and Chemicals Corporation, Ltd., average particle size of 20 µm, purity of 99.9%) was used as the sample 7 and the treatment was performed under the conditions shown in Table 1. The results are shown in Table 1.

Example 8-1, Example 8-2, and Comparative Example 8-1

Pt powder (manufactured by The Nilaco Corporation, average particle size of 5 µm, purity of 99.9%) was used as the sample 7 and the treatment was performed under the conditions shown in Table 1. The results are shown in Table 1.

Example 9-1, Example 9-2, and Comparative Example 9-1

Fe powder (manufactured by The Nilaco Corporation, average particle size of 70 µm, purity of 99.9%) was used as the sample 7 and the treatment was performed under the conditions shown in Table 1. The results are shown in Table 1.

Example 10-1, Example 10-2, and Comparative Example 10-1

Co powder (manufactured by Merck, average particle size of 2 µm, purity of 99.8%) was used as the sample 7 and the treatment was performed under the conditions shown in Table 1. The results are shown in Table 1.

Example 11-1, Example 11-2, and Comparative Example 11-1

Ni powder (manufactured by The Nilaco Corporation, average particle size of 50 µm, purity of 99.9%) was used as the sample 7 and the treatment was performed under the conditions shown in Table 1. The results are shown in Table 1.

Comparative Example 12

The metal removal treatment was performed in the same manner as in Example 1-1, except that $SF_6$, $NF_3$, $SiF_4$, $CF_4$, $CHF_3$, or a mixture of each of the etching gases and $NH_3$ was used as the etching gas. A mass reduction was not observed in each case of using any of the etching gases. In addition, when the treatment was performed by changing the temperature condition in the reaction step from 30° C. to 100° C. or 0° C. or when the temperature condition in the volatilization step was changed from 100° C. to 50° C. or 350° C., a reduction in the mass of the Ir powder was not observed. These results were all the same not only when the Ir powder was used as the sample 7 but when W, Se, Mo, Rh, Pd, Re, Pt, Fe, Co, and Ni powders were used.

Reference Example 1-1, Reference Example 1-2, Reference Example 1-3, and Reference Example 1-4

$SiO_2$ powder (manufactured by Marutou CO., LTD., average particle size of 50 µm, purity of 99.9%) was used as the sample 7 and the treatment was performed under the conditions shown in Table 1. The results are shown in Table 1.

Reference Example 2-1, Reference Example 2-2, Reference Example 2-3, and Reference Example 2-4

$Si_3N_4$ powder (manufactured by UBE INDUSTRIES, LTD., average particle size of 50 μm, purity of 99.9%) was used as the sample 7 and the treatment was performed under the conditions shown in Table 1. The results are shown in Table 1.

As is understood from Examples 1-1, 1-2, 1-3, and 1-4, the etching of Ir was able to be achieved by performing the reaction at 0° C. or 30° C. using $BrF_5$ or $IF_7$ as the etching gas in the reaction step and performing the heating to 100° C. in the vacuum environment in the volatilization step.

On the other hand, as is understood from Comparative Example 1-1, when $F_2$ was used as the etching gas in the reaction step, the etching of Ir did not proceed. As is understood from Comparative Example 1-2, even in the case of using $BrF_5$ as the etching gas, when only the reaction step was performed without performing the volatilization step, Ir was not be able to be etched and the mass of the sample 7 increased.

As is understood from the results of Examples 1-5 to 1-12, the etching of Ir was able to be achieved even when the treatment gas in which inert gas was mixed with $BrF_5$ or $IF_7$ was used in the reaction step.

As is understood from Examples 2-1, 2-2, 4-1, 4-2, 5-1, 5-2, 7-1, 7-2, 8-1, 8-2, the etching of W, Mo, Rh, Re, and Pt was able to be achieved by performing the reaction using $BrF_5$ or $IF_7$ as the etching gas at 30° C. in the reaction step and performing the heating to 100° C. in the vacuum environment in the volatilization step.

On the other hand, as is understood from Comparative Examples 2-1, 4-1, 5-1, 7-1, 8-1, when $F_2$ was used as the etching gas in the reaction step, the etching of W, Mo, Rh, Re, and Pt did not proceed.

As is understood from Examples 3-1, 3-2, the etching of Se was able to be achieved by performing the reaction using $BrF_5$ or $IF_7$ as the etching gas at 30° C. in the reaction step and performing the heating to 50° C. in the vacuum environment in the volatilization step.

On the other hand, as is understood from Comparative Example 3-1, when $F_2$ was used as the etching gas in the reaction step, the etching of Se did not proceed.

As is understood from Examples 6-1, 6-2, the etching of Pd was able to be achieved by performing the reaction using $BrF_5$ or $IF_7$ as the etching gas at 30° C. in the reaction step and performing the heating to 350° C. in the vacuum environment in the volatilization step.

On the other hand, as is understood from Comparative Example 6-1, when $F_2$ was used as the etching gas in the reaction step, the etching of Pd did not proceed.

As is understood from Examples 9-1, 9-2, 10-1, 10-2, 11-1, 11-2, the etching of Fe, Co, and Ni was able to be achieved by performing the reaction using $BrF_5$ or $IF_7$ as the etching gas at 100° C. in the reaction step and performing the heating to 350° C. in the vacuum environment in the volatilization step.

On the other hand, as is understood from Comparative Examples 9-1, 10-1, 11-1, when $F_2$ was used as the etching gas in the reaction step, the etching of Fe, Co, and Ni did not proceed.

As is understood from Reference Examples 1-1, 1-2, 2-1, 2-2, when the reaction was performed at 30° C. using $BrF_5$ or $IF_7$ as the etching gas in the reaction step, the etching of $SiO_2$ and $Si_3N_4$ did not proceed.

As is understood from Reference Examples 1-3, 1-4, 2-3, 2-4, also when the reaction was performed at 100° C. using $BrF_5$ or $IF_7$ as the etching gas in the reaction step, the etching of $SiO_2$ and $Si_3N_4$ only slightly proceeded.

The results above show that, when the metal removal treatment of each of Examples described above is performed, Fe, Co, Ni, Se, Mo, Rh, Pd, W, Re, Ir, and Pt can be selectively etched without etching $SiO_2$ or $Si_3N_4$.

Example 12-1, Example 12-2, and Comparative Example 13

The metal removal treatment, i.e., etching, was applied to the sample 7 of Example 12-1, Example 12-2, and Comparative Example 13 using the reactor 1 in FIG. 1. The sample 7 used in Example 12-1, Example 12-2, and Comparative Example 13 is described with reference to FIG. 2.

Figure 2:
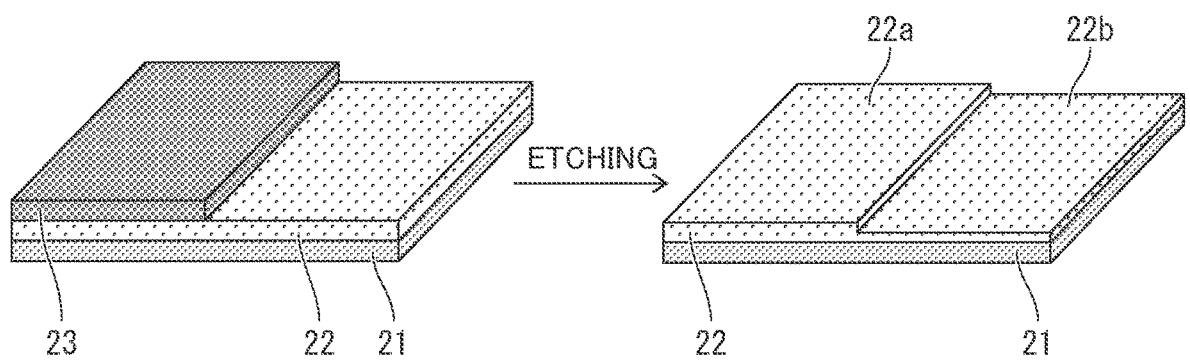

One was prepared in which a tungsten film 22 having a thickness of 1 μm was formed on a square silicon substrate 21 having a side of 2 in. (manufactured by KST World Corp.), and a rectangular silicon dioxide substrate 23 having a dimension of 1 in.×2 in. was bonded onto the tungsten 22 using grease (Demnum Grease L-200 manufactured by Daikin Industries, Ltd.), and the resultant substance was used as the sample 7. The silicon dioxide substrate 23 was bonded to cover substantially the half of the tungsten film 22 as illustrated in FIG. 2. The tungsten film 22 is the target to be removed, i.e., the target to be etched, and the silicon dioxide substrate 23 was used as a resist.

The etching was performed using the sample 7 under the conditions shown in Table 2. The conditions other than the conditions shown in Table 2 are the same as those of Example 1-5. When the etching was completed, the chamber was opened to take out the sample 7, the silicon dioxide substrate 23 was removed from the taken-out sample 7, and the bonded surface was cleaned with ethanol to remove the grease. Then, the size of a level difference between a covered surface 22a of the tungsten film 22 which was covered with the silicon dioxide substrate 23 and was not etched and an etched surface 22b of the tungsten film 22 which was not covered with the silicon dioxide substrate 23 and was etched was measured using an atomic force microscope VN-8010 manufactured by KEYENCE CORPORATION. The tungsten etching rate (nm/min) was calculated by dividing the measured level difference size (nm) by etching time (min). The results are shown in Table 2.

The measurement conditions of the size of the level difference by the atomic force microscope are as follows.

Measurement pressure: Atmospheric pressure (101.3 kPa)

Measurement temperature: 28° C.

Measurement atmosphere: In atmosphere

Scanning range: Width of 80.0 μm, Height of 20.0 μm, Angle of 0°

TABLE 2

| | | Reaction step | | | Volatilization step | Etching |
| | Sample | Etching gas | Inert gas | Etching gas/Inert gas (sccm/sccm) | Temperature (° C.) | Temperature (° C.) | rate (nm/min) |
|---|---|---|---|---|---|---|---|
| Ex. 12-1 | W | BrF$_5$ | Ar | 10/90 | 30 | 50 | 56 |
| Ex. 12-2 | W | IF$_7$ | Ar | 10/90 | 30 | 50 | 62 |
| Comp. Ex. 13 | W | F$_2$ | Ar | 10/90 | 30 | 50 | 1 |

Example 12-1 and Example 12-2 show that the etching proceeds with no problems even when the removal target, i.e., etching target, is a film. On the other hand, Comparative Example 13 shows that, when a fluorine gas was used as the etching gas, the etching hardly proceeds.

REFERENCE SIGNS LIST 1 reactor
3 chamber
5 stage
7 sample
11 gas introduction port
13 gas discharge port
15 pressure gauge
21 silicon substrate
22 tungsten film
23 silicon dioxide substrate

The invention claimed is:

1. A metal removal method comprising:
a reaction step of bringing a treatment gas containing a fluorine-containing interhalogen compound and a metal-containing material containing a metal element into contact with each other to generate metal fluoride which is a reaction product of the fluorine-containing interhalogen compound and the metal element; and
a volatilization step of heating the metal fluoride under an inert gas atmosphere or in a vacuum environment for volatilization, wherein
the fluorine-containing interhalogen compound is at least one kind selected from the group consisting of bromine monofluoride and bromine pentafluoride;
the metal element is at least one kind selected from the group consisting of selenium, palladium, rhenium, and iridium; and
wherein the reaction step is performed not using plasma.

2. The metal removal method according to claim 1, wherein
the treatment gas contains at least one kind of inert gas selected from the group consisting of nitrogen gas, helium, neon, argon, krypton, and xenon.

3. The metal removal method according to claim 2, wherein
a reaction temperature of the fluorine-containing interhalogen compound and the metal element in the reaction step is 0° C. or more and 100° C. or less.

4. The metal removal method according to claim 2, wherein
a heating temperature of the metal fluoride in the volatilization step is higher than the reaction temperature of the fluorine-containing interhalogen compound and the metal element in the reaction step.

5. The metal removal method according to claim 2 comprising
in the reaction step, bringing the treatment gas into contact with a silicon-containing material containing at least one of silicon oxide and silicon nitride and the metal-containing material.

6. The metal removal method according to claim 1, wherein
a reaction temperature of the fluorine-containing interhalogen compound and the metal element in the reaction step is 0° C. or more and 100° C. or less.

7. The metal removal method according to claim 6, wherein
a heating temperature of the metal fluoride in the volatilization step is higher than the reaction temperature of the fluorine-containing interhalogen compound and the metal element in the reaction step.

8. The metal removal method according to claim 6 comprising
in the reaction step, bringing the treatment gas into contact with a silicon-containing material containing at least one of silicon oxide and silicon nitride and the metal-containing material.

9. The metal removal method according to claim 1, wherein
a heating temperature of the metal fluoride in the volatilization step is higher than the reaction temperature of the fluorine-containing interhalogen compound and the metal element in the reaction step.

10. The metal removal method according to claim 9, wherein
the heating temperature of the metal fluoride in the volatilization step is 50° C. or more and 400° C. or less.

11. The metal removal method according to claim 10 comprising
in the reaction step, bringing the treatment gas into contact with a silicon-containing material containing at least one of silicon oxide and silicon nitride and the metal-containing material.

12. The metal removal method according to claim 9 comprising
in the reaction step, bringing the treatment gas into contact with a silicon-containing material containing at least one of silicon oxide and silicon nitride and the metal-containing material.

13. The metal removal method according to claim 1 comprising
in the reaction step, bringing the treatment gas into contact with a silicon-containing material containing at least one of silicon oxide and silicon nitride and the metal-containing material.

14. A dry etching method, using the metal removal method according to claim 1.

15. A production method for a semiconductor element comprising:
a dry etching step of removing at least one portion of a metal-containing layer containing at least one kind of metal element selected from the group consisting of selenium, palladium, rhenium, and iridium, from a semiconductor substrate having the metal-containing layer using the dry etching method according to claim 14.

* * * * *